US008772681B2

(12) United States Patent
May

(10) Patent No.: US 8,772,681 B2
(45) Date of Patent: Jul. 8, 2014

(54) METHOD AND APPARATUS FOR FORCED AIR HEATER MEASUREMENT AND CONTROL

(75) Inventor: Joe T. May, Sterling, VA (US)

(73) Assignee: Electronic Instrumentation and Technology, Inc., Sterling, VA (US)

( * ) Notice: Subject to any disclaimer, the term of this patent is extended or adjusted under 35 U.S.C. 154(b) by 1215 days.

(21) Appl. No.: 11/940,682

(22) Filed: Nov. 15, 2007

(65) Prior Publication Data

US 2009/0127347 A1    May 21, 2009

(51) Int. Cl.
  F24D 5/00    (2006.01)
  H05K 9/00    (2006.01)
  B22F 1/00    (2006.01)
  F24D 19/10    (2006.01)

(52) U.S. Cl.
  CPC .......... *H05K 9/0083* (2013.01); *H05K 9/0088* (2013.01); *B22F 2998/10* (2013.01); *B22F 1/0055* (2013.01); *B22F 1/0059* (2013.01); *F24D 19/1096* (2013.01)
  USPC ........... 219/494; 392/379; 392/380; 392/381; 392/382; 392/383; 392/384; 392/385; 431/90; 431/12

(58) Field of Classification Search
  CPC ............ B22F 2998/00; B22F 2998/10; B22F 1/0055; B22F 1/0059; B22F 2003/145; B22F 3/14; B22F 5/006; B22F 7/04; C22C 2202/02; F24D 19/1084; F24D 19/1096; F24D 5/02; F24H 3/022; F24H 3/0411; F24H 9/2064; H01F 41/16; H05K 9/0083; H05K 9/0088
  USPC ................. 219/494; 431/90, 12; 392/379–385
  See application file for complete search history.

(56) References Cited

U.S. PATENT DOCUMENTS

| | | | | |
|---|---|---|---|---|
| 5,873,356 | A * | 2/1999 | Vossler et al. .............. | 126/110 E |
| 6,349,722 | B1 * | 2/2002 | Gradon et al. ........... | 128/203.17 |
| 6,557,411 | B1 * | 5/2003 | Yamada et al. ............ | 73/204.26 |
| 6,684,695 | B1 * | 2/2004 | Fralick et al. .............. | 73/204.26 |
| 6,918,389 | B2 * | 7/2005 | Seakins et al. ........... | 128/203.27 |
| 7,458,615 | B2 * | 12/2008 | White et al. .................. | 285/272 |
| 7,493,902 | B2 * | 2/2009 | White et al. ............. | 128/207.18 |
| 2004/0102731 | A1 * | 5/2004 | Blackhurst et al. ............. | 604/26 |
| 2004/0261797 | A1 * | 12/2004 | White et al. ............. | 128/206.11 |
| 2005/0077726 | A1 * | 4/2005 | White et al. ............... | 285/147.1 |
| 2005/0199735 | A1 * | 9/2005 | Eisenhour et al. ........... | 236/1 C |
| 2006/0266359 | A1 * | 11/2006 | Van Beurden et al. .. | 128/205.24 |
| 2008/0028850 | A1 * | 2/2008 | Payton et al. .............. | 73/204.19 |
| 2008/0190427 | A1 * | 8/2008 | Payton et al. ............. | 128/203.27 |
| 2008/0196722 | A1 * | 8/2008 | Kramer et al. ........... | 128/204.22 |
| 2010/0043791 | A1 * | 2/2010 | McAuley et al. ........ | 128/203.14 |

* cited by examiner

*Primary Examiner* — Henry Yuen
*Assistant Examiner* — Diallo I Duniver
(74) *Attorney, Agent, or Firm* — Whitham Curtis Christofferson & Cook, PC

(57) ABSTRACT

A blower urges an airflow, at a rate according to a user-controlled flow rate command, through an electric heater and the electrical heater heats the airflow at a heater power based on a user-input temperature command, the user-input flow rate command, and a measured mass flow rate of the airflow. The heater power is calculated based on the heat energy required to heat air to the given reference temperature, at a flow rate corresponding to the measured mass flow rate. Optionally, the temperature of the air entering the electric heater is measured, and the heater power is calculated based on the heat energy required to heat air from the measured temperature to the given reference temperature, at a flow rate corresponding to the measured mass flow rate.

9 Claims, 2 Drawing Sheets

METHOD AND APPARATUS FOR FORCED AIR HEATER MEASUREMENT AND CONTROL

TECHNICAL FIELD

The field of the invention is heated forced air delivery, more specifically, a forced air heater providing an airflow controlled at a selected temperature and at a selected mass flow rate or at a selected air velocity.

BACKGROUND OF THE INVENTION

High power air heaters are used, for example, in manufacturing and other commercial applications and may have up to, for example, approximately thirty kilowatts (kW) of power. Example applications include, without limitation, heat shrink wrapping, drying/curing of surface coatings and thermal reflow adhesives, and heating of materials for forming purposes.

Related Art FIG. 1 shows a typical related art heated air system 10, having a blower 12 connected to a heater tube 14 having a resistance or other type of electrical heating element 14A, to output heated air 16. For the remainder of this description, unless otherwise stated, the phrase "electrical heating element" means any element that converts electrical energy to heat energy transferable to flowing air. Measurement of the temperature of the heated airflow 16 is via thermocouple sensor 18 arranged in the electrical heater tube 14, directly within the hot air flow 16.

With continuing reference to Related Art FIG. 1, control of the temperature of the heated air 16 is a feedback operation, performed by the thermocouple sensor 18 outputting a temperature measurement signal 20 that connects to a user interface/controller 22, into which a user inputs a desired temperature (by, for example, a control knob or keypad.) The user interface/controller compares the user input desired temperature to the temperature measurement signal 20, and generates a power control signal 24 based on the error or difference. The power control signal 24 is input to a power controller 26, which limits electrical power delivered to the heater element 14A from the electrical source 27, e.g., a utility power line.

Referring to Related Art FIG. 1, in accordance with conventional feedback, the user interface/controller 22 automatically adjusts the value of the power control signal 24 to the point the electrical heater element 14A heats the air 16 to a temperature, as measured by the thermocouple sensor 18, where the error or difference between the user input desired temperature and temperature measurement signal 20 is (within a given design accuracy of) zero. It is clear that the thermocouple 18 is essential to this operation.

Related art forced air heaters such as, for example, systems depicted at Related Art FIG. 1, have shortcomings. One shortcoming is the direct component cost of the thermocouple and associated circuitry. Another is that thermocouples may have a high failure rate, and failures typically result in lost production time and output. For example, a thermocouple failure may result in the heated air 16 being so hot that significant quantities of product are damaged or destroyed before the failure is detected. Further, thermocouples typically deteriorate over time, due to their intense heat exposure. Placing the thermocouple in a well is one known method for reducing this heat deterioration but, because of the distance between the flow and the well and because of reduced air flow on the thermocouple, the result is a significant delay between changes in the temperature of the air flow and corresponding changes in the thermocouple measurement. This time delay can have detrimental effects on the temperature control loop. Further, even at a steady state air flow temperature, the temperature in the well may be hotter or colder than the air flow temperature, thereby further causing inaccurate the temperature control.

In addition, referring to the example system depicted at Related Art FIG. 1, often a vane switch (not shown) or other air flow detector device (not shown) is arranged in the airflow preceding the heater tube 14—for the intended purpose of detecting loss or stoppage of airflow and switching off the heating element power before the electrical heating element 14A is destroyed from overheating. However, such vane switches and other air flow detector devices often have such a delay time that, if air flow ceases, the heating element 14A is destroyed before power is switched off. Equally significant is that such airflow detector switches and devices often have a high mechanical failure rate.

SUMMARY OF THE INVENTION

The described system and method outputs heated air at a directly controlled temperature, without requiring any thermocouple in any heated airflow.

According to one aspect, the system and method outputs air at a directly controlled mass flow rate, at a directly controlled temperature without any thermocouple in any heated airflow.

According to one aspect, the system and method outputs air at a directly controlled air velocity, at a directly controlled temperature, without any thermocouple in any heated airflow.

One example according to one embodiment includes an air blower connected to an electrical air heater, the heater having a tube or equivalent and a heater exhaust nozzle output port, the example having a mass flow sensor for detecting a mass flow of air through the air blower, an input temperature sensor for detecting temperature of air entering the electrical air heater, and a controller for controlling the air flow urged by the blower and for controlling power to the electrical air heater, the controller arranged to control the air flow urged by the air blower based on a received air flow rate command, and arranged to control the power to the electrical air heater based on a received air output temperature command, the received air flow rate command and the detected mass flow through the air blower. According to one example, the control of the air flow urged by the air blower may be implemented by including an air throttle in the air path preceding the electrical air heater, and arranging the controller to control the air throttle. According to another example, the control of the air flow urged by the air blower may be implemented by a controllable power air blower and arranging the controller to control the air blower.

According to one aspect, the controller is arranged to control power to the electrical air heater by generating an electrical air heater power control signal proportional to an arithmetic product of the air output temperature command and a mass flow measurement signal generated by the mass flow sensor.

According to one aspect, the controller is arranged to receive the air flow rate command as a mass flow command, and to control the flow of air urged by the air blower by feedback based on comparing the mass flow command to the mass flow measurement signal. This aspect provides direct user control of the output air temperature and the output mass flow. Stated differently, this aspect provides air output from the exhaust nozzle output port with a temperature and a mass flow as two variables directly controlled by the user.

According to one aspect, the controller is arranged to receive the air flow rate command as an air output velocity command and to convert the velocity command to a calculated mass flow value, based on a given conversion factor, the conversion factor based on the area of the exhaust nozzle output port and the received output air temperature command. According to this aspect, the controller is arranged control the air flow rate of the blower by feedback, based on comparing the calculated mass flow value to the mass flow measurement signal.

This one aspect provides direct user control of the output air temperature and the output air velocity. Stated differently, this aspect provides heated air output from the exhaust nozzle output port with a temperature and a velocity as two variables directly controlled by the user.

DETAILED DESCRIPTION OF ILLUSTRATIVE EMBODIMENTS

Figure 1:
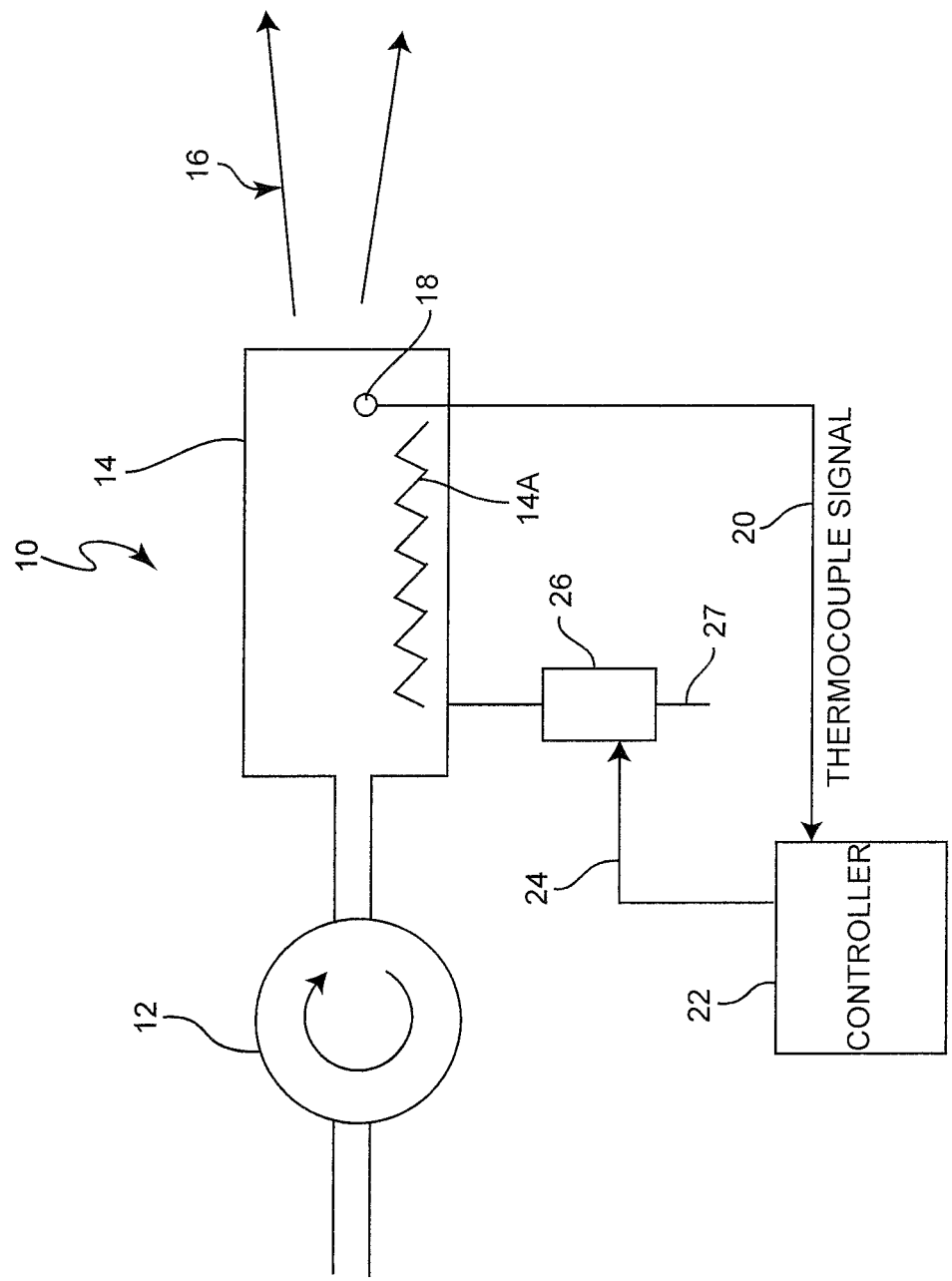
FIG. 1 illustrates an exemplar of a related art heated air delivery apparatus.

It is to be understood that the present invention is not limited to the specific examples described herein or depicted by the attached drawings, and that other configurations and arrangements can, upon reading this description, be readily implemented by persons skilled in the pertinent arts.

In the drawings, like numerals appearing in different drawings, either of the same or different embodiments of the invention, reference functional or system blocks that may be identical or substantially identical between the different drawings.

It is to be understood that the various embodiments of the invention, although different, are not necessarily mutually exclusive. For example, a particular feature, function, act or characteristic described in one embodiment may, within the scope of the invention, be included in other embodiments.

Various instances of the phrase "in one embodiment" do not necessarily refer to the same embodiment.

The terms "comprising", "including", "having" and "including" and all respective grammatical forms of each, are defined according their broadest respective dictionary meanings, and are interchangeable with one other, except where otherwise stated or where otherwise clear from the particular context in which the term appears.

It will be understood that, unless otherwise stated or made clear by a particular context to be otherwise, the terms "calculate(s)" and "calculation(s)" are not limited to conventional arithmetic operations such as digital addition, subtraction, multiplication and division but, instead, further encompass all acts, structures, methods and processes that generate a result based on the identified operands of the "calculation," including, but not limited to, look-up tables, sequential operations by a programmable processor or processors, single-clock or multiple clock operations by, for example, dedicated adders, subtractors, multipliers, or equivalents, and any known method of approximation.

Figure 2:
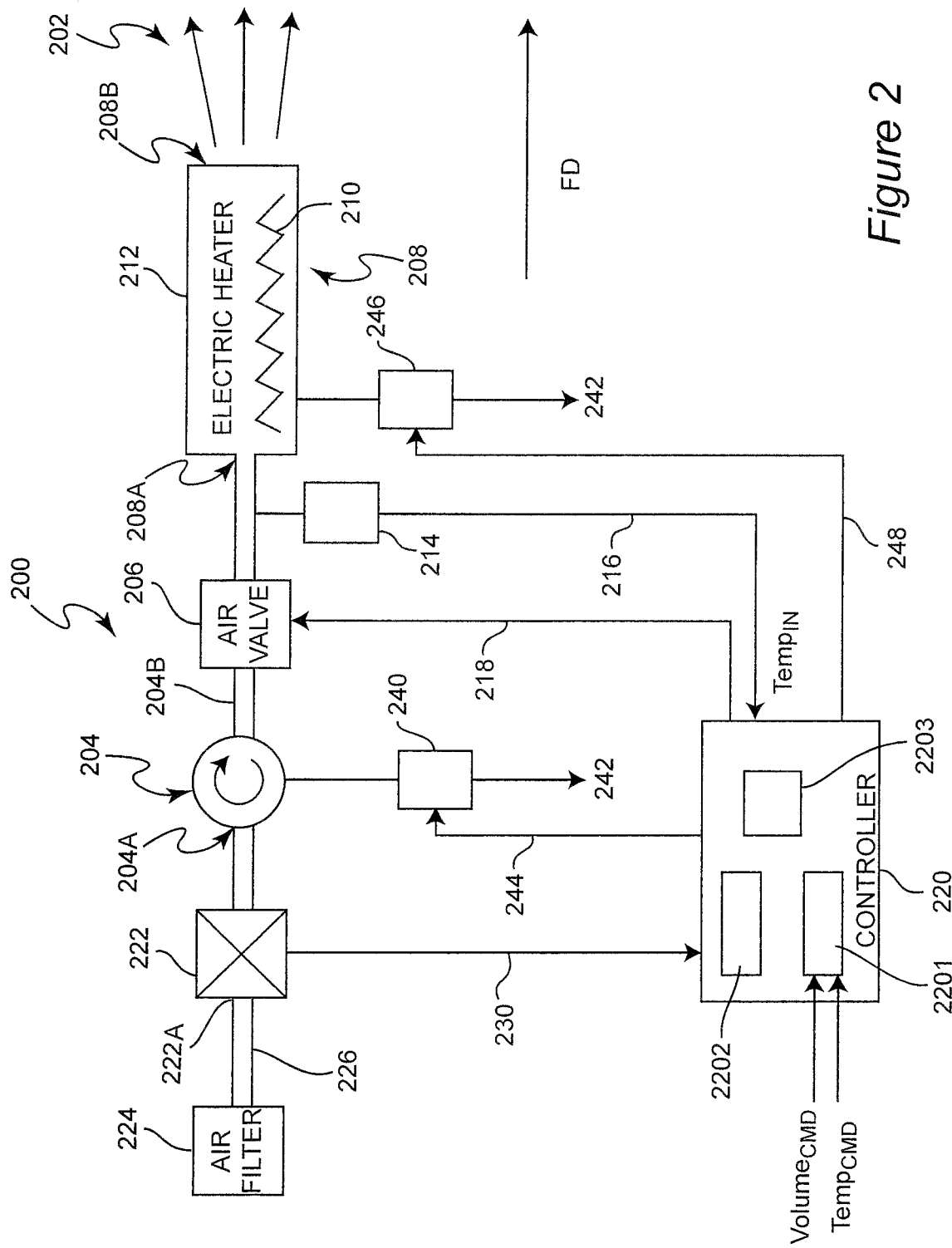
FIG. 2 schematically illustrates one example system providing forced heated air, controlled at a selectable output temperature and a selectable output mass flow rate.

FIG. 2 schematically illustrates one example system 200 that generates forced heated air 202, at an output temperature $Temp_{OUT}$ and at an output flow rate $AirFlow_{OUT}$, where $AirFlow_{OUT}$ may be selectable between a mass flow and a velocity, as described in further detail below, and where $Temp_{OUT}$ and $AirFlow_{OUT}$ are each within a respective given accuracy of a user-input temperature command $Temp_{CMD}$ and a user-input air flow rate command $AirFlow_{CMD}$, without requiring or having any thermocouple within any heated air flow.

According to one aspect, which is described in further detail below, the user-input $AirFlow_{CMD}$ is a mass flow rate, which may be in terms of any unit mass per unit time such as, for example, grams per second, pounds per minute, or may be expressed as standard cubic feet per minute (SCFM). A User-input $AirFlow_{CMD}$ in terms of mass flow rate may be referenced as $MassFlow_{CMD}$.

According to another aspect, which is described in further detail below, the user-input $AirFlow_{CMD}$ is an air velocity of the output air, which may be in terms of any linear distance per unity time such as, for example, meters-per-second, miles-per-hour, or feet-per-second. A user-input $AirFlow_{CMD}$ in terms of output air velocity may be referenced as $OutVelocity_{CMD}$.

With continuing reference to FIG. 2, the example system 200 includes an electric air blower 204, having an air input 204A and an air output 204B connecting through a controllable air valve or throttle 206 to an input 208A of an electric air heater 208. The electric air heater 208 may, for example, be a resistance-type electrical air heater having a resistance-type heating element 210 arranged, for example, within a tube 212. The illustrated structures 210 and 212 are not necessarily drawn to scale, and are not necessarily implemented as separate structures. Further, it will be understood that implementations (not shown) using an electric air heater of a type other than a resistance-type air heater may be used, and may have a relative arrangement of the electrical heat source (not shown) heating an air flow through a tube (not shown) corresponding to the FIG. 2 tube 212.

With continuing reference to FIG. 2, in the example system 200 a temperature sensor 214 is arranged between the output 204B of the air blower 204 and the input 208A of the air heater 208. The temperature sensor 214 is preferable, but may be omitted for, example, in applications having a known, fixed ambient air temperature. The temperature sensor 214 detects the temperature of the air flowing into the electrical air heater 208 and outputs a corresponding signal, labeled $Temp_{IN}$, on line 216 to the system controller 220 that is described in further detail below. As will be understood based on this disclosure, based on the temperature sensor 214 the system controller 220 calculates the electrical energy required to heat the air flowing through the air heater 208, which is controlled according a user-input mass flow rate or a user-input velocity, whichever is selected by the user, to the user-input temperature command.

Referring to FIG. 2, in the example system 200 the electrical air heater 208 may have a nominal power output of, for example, approximately 1 KW. In one alternative, the electrical air heater 208 may have a nominal power output of, for example, approximately 5 KW. These are only illustrative examples, as other power ranges may be readily identified and implemented by persons of ordinary skill in the art based on this disclosure.

With continuing reference to FIG. 2, in the example system 200 one example implementation of the electrical air heater 208 is a commercial off-the-shelf heater, such as is available from various vendors, by persons skilled in the relevant art based on a particular application and system requirements specification, upon reading this disclosure. One example implementation of the air blower 204 is a commercial off-the-shelf air blower, readily selected from various models available from various vendors by persons skilled in the relevant art, based the present disclosure in view of a particular application and system requirements specification.

With continuing reference to FIG. 2, in the example system 200 the controllable air throttle 206 is controlled by a flow control signal 218 generated by the system controller 220, which is described in greater detail below.

Referring to FIG. 2, in the example system 200 a mass flow sensor 222 is arranged, preferably upstream of the air blower 204, "upstream" meaning a direction opposite the airflow direction FD. Preferably an air filter 224 connects, via an air conduit 226, to an input 222A of the mass flow sensor 222. Preferably, the physical connection between the air filter 224 and the air conduit 226, and the physical connection between the air conduit 226 and the input 204A of the air blower 204, are air tight, particularly at the air pressures exhibited at these connections during operation of the example system 200. The identified physical connections are preferably airtight because leaks may allow unfiltered air, which may have suspended particulate matter, to pass through the mass flow sensor 222, the air blower 204, and the air heater 208. Such particulate matter may be abrasive to internal surfaces (not separately numbered) of these structures. Further, a leak may potentially disturb an accuracy of measurements downstream of the leak.

With continuing reference to FIG. 2, the example system 200 shows two options for controlling the mass flow through the air heater 208, one being a blower control 244, generated by the system control 220, to control the power to the blower motor 204, the other being a throttle valve 206 embodying a variable orifice constriction (not shown) controlled by the throttle control signal 218, which is generated by the system controller 220. Systems embodying the invention, including systems according to FIG. 2 may, however, include only the throttle valve 206, and omit the blower control signal 218. It will be understood that the particular blower motor 204 used with this option must be capable of operating at fixed power against a varying resistance. As known to persons of ordinary skill in the art, various off-the-shelf blowers having such capability are available from multiple vendors.

Referring to FIG. 2, the mass flow sensor 222 transmits a mass flow measurement signal 230 to the system controller 220. One example implementation of the mass flow sensor 222 is a conventional, off-the-shelf industrial mass air flow sensor such as, for example, a mass flow sensor from a fuel/air delivery system of an automobile, illustrative examples being a Volkswagen Jetta®. These are only illustrative examples; other implementations of the mass flow sensor 222 such as, for example, other off-the-shelf units available from various vendors that are readily selected by persons skilled in the relevant arts based on this disclosure.

Referring to the FIG. 2 example system 200, in implementations using the air throttle 206 to control air flow urged by the blower 204, the throttle 206 be implemented with an off-the-shelf gas flow or throttle valve such as, for example, a commercially available throttle valve for controlling natural gas flow to a natural gas powered vehicle, e.g., a natural gas powered bus, having a stepper-type motor (not shown) and orifice adjusting actuator (not shown). Such throttle valves are available from various vendors, and are readily selected and arranged for practicing the embodiments by persons of ordinary skill in the art based on this disclosure.

With continuing reference to FIG. 2, in the example system 200, implementations controlling the air flow urged by the blower 204 by controlling the blower power include a power control circuit such as 240, connected to a power source 242. In the example system 200 the blower power control circuit 240 is controlled by a blower control signal, represented as line 244 connecting to the system controller 220, which is described in greater detail below.

With continuing reference to FIG. 2, in the example system 200 the power source 242 may, for example, be a utility power feed line, supplying alternating current (AC), at a voltage of, for example 110 volts, 220 volts or and 440 volts AC, and may be single-phase or multiphase. Alternatively, the power source 242 may be a portable AC generator (not shown). Alternatively, the power source may be a storage battery (not shown).

Referring to FIG. 2, in the example system 200 electrical power to the air heater 208 is controlled by, for example, a heater power control circuit 246 connected to a power source such as, for example, the same power source 242 powering the air blower 204. In the example system 200, the heater power control circuit 246 is controlled by a heater control signal, represented as line 248 connecting to the system controller 220.

With continuing reference to FIG. 2, in the example system 200 the air blower 204 and electrical air heater 208 may, for example, have the same voltage requirement, which may be the voltage delivered by the power source 242. In one alternative example, the voltage requirement for one or both of the air blower 204 and electrical air heater 208 may differ, in which case a power converter (not shown) or equivalent, or a different supply voltage (not shown) may be inserted.

Referring to FIG. 2, in the example system 200 the system controller 220 may, for example, be implemented as a programmable microprocessor-based unit having, for example, a user command interface, e.g., keypad 2201, a display 2202, and a microprocessor circuit 2203 having a microprocessor (not shown), data storage (not shown), instruction storage (not shown), and an internal bus (not shown). Based on the present disclosure, various implementations of the system controller 220 are readily constructed by persons of ordinary skill in the relevant arts. For example, the system controller 220 may be implemented with a single-chip microcontroller (not shown). One example implementation of the display is a liquid crystal (LCD) or light emitting diode (LED) display.

With continuing reference to FIG. 2, in the example system 200 the user inputs to the system controller 220 using, for example, a keypad implementing the interface 2202 the user input command $Temp_{CMD}$ for the desired temperature of the output heated air 202, and the user input command $AirFlow_{CMD}$, which may be the $MassFlow_{CMD}$ representing a user-input mass flow command or the $OutVelocity_{CMD}$ representing a user-input air velocity command.

The $MassFlow_{CMD}$ is a mass per unit time. The units may be, in, for example, Standard Cubic Feet Per Minute (SCFM) which, notwithstanding the name, is a mass per unit time. The specific the format and dimensional units of the user-input commands $Temp_{CMD}$, $MassFlow_{CMD}$ and $OutVelocity_{CMD}$, though, are a design choice, in any form or any dimensional unit, as any form or dimensional unit is readily converted, by a straightforward arrangement of the system controller 220, into any mass flow and temperature unit selected to carry out the calculations described herein.

Referring to FIG. 2, in the example system 200 the system controller 220 is arranged to generate the throttle valve control signal 218 and/or the blower control signal 244 to produce a flow rate according to the user input $MassFlow_{CMD}$ or $OutVelocity_{CMD}$.

With continuing reference to FIG. 2, as readily understood by persons of ordinary skill in the art based on this disclosure, arrangement of the system controller 220 to generate the throttle valve control signal 218 and/or the blower control signal 244 to produce a mass flow rate according to a user-input $MassFlow_{CMD}$ will be described, based on given specifications of the hardware implementation of the system such as, for example, specifications of the air blower 204 and throttle 206.

With continuing reference to FIG. 2, one example arrangement of the system controller 220 to generate the heater power control signal 248 is described with, as an illustrative example, the user input command in terms of mass flow rate, e.g., MassFlow$_{CMD}$. Referring to FIG. 2, the heater control signal 248 may be generated according to the following transfer relation:

$$Temp_{CMD} = Temp_{IN} + \Delta T \quad \text{(Equation No. 1)};$$

$$Temp_{CMD} = Temp_{IN} + ((K \times PowerIn / MassFlow)) \quad \text{(Equation No. 2)};$$

and $$PowerIn = (Temp_{CMD} - Temp_{IN}) \times MassFlow / K \quad \text{(Equation No. 3)}$$

where:
PowerIn equals the power, in watts, that must be delivered by the air heater 208 to the air passing from the heater input 208A to the heater exhaust nozzle output port 208B to achieve the desired $\Delta T$,
K is a constant of proportionality accounting for the specific heat of the air and for characteristics specific to the particular hardware implementation such as, for example, the specific transfer characteristic of the heater power control circuit 246 with respect the heater control signal on line 248, and
MassFlow is the mass airflow of the output air 202, which is defined by the MassFlow$_{CMD}$.

With continuing reference to FIG. 2, the system controller 220 is readily arranged by, for example, readily constructed software instructions, to generate the heater control signal 248, based on Equation No. 3.

For example, referring to the FIG. 2, in the example system 200 the system controller 220 receives Temp$_{IN}$ from the temperature sensor 214, and receives the mass airflow signal 230 from the mass flow sensor 222. The voltage of the current delivered to the air heater 208 is known, or readily determinable (based on the voltage of the power source 242 or any power converter inserted between the power source 242 and the electrical air heater 208). Therefore, PowerIn of Equation No. 3 is equal to this voltage multiplied by the current (i.e., amps) the heater power control circuit 246 delivers to the air heater 208. Stated differently, the power the heater power control circuit 246 must deliver to the air heater 208, to generate air 202 from the air exhaust nozzle output port 208B at Temp$_{CMD}$ is equal to PowerIn, defined according to Equation No. 3, divided by the voltage.

In the above-described example, the temperature of the output air 202 from the exhaust nozzle output port 208B and the mass flow rate of air at the output 202 are directly controlled by the user. The system controller 220 directly controls the mass flow rate, according to the user-input MassFlow$_{CMD}$, by controlling the throttle 206. The system controller 220 controls the throttle 206 by generating the throttle control signal 218 (and/or controls the power to the blower motor 204 by generating the blower control signal 244) in a feedback manner, comparing the mass flow detected by the mass flow sensor 222 against the input MassFlow$_{CMD}$. The system controller 220 controls the power to the air heater 208, according to the user-input Temp$_{CMD}$, based on the controlled mass flow (which may be either the MassFlow$_{CMD}$ or the flow measured by the mass flow sensor 222) and the measured temperature of the air input to the air heater 208, according to Equation Nos. 1-3 above.

In another example embodiment, the temperature of the output air 202 and the velocity of the air 202 are directly controlled by the user. One example according to this embodiment includes the above-described example, with an additional aspect of the system controller 220 receiving the user-input Temp$_{CMD}$ and receiving a user-input velocity command, such as OutVelocity$_{CMD}$. The system controller 220 calculates the mass air flow of intake air into the air heater 208 which, when heated to the user-input Temp$_{CMD}$ temperature will flow through the exhaust nozzle output port 208B at the user-input OutVelocity$_{CMD}$ velocity. As will be understood by a person of ordinary skill in the art upon reading this disclosure, the system controller 220 calculates this mass air flow based on the density of the air and the cross sectional area of the exhaust nozzle output port 208B. The air density value may be a fixed data stored in the system controller 220 or may, as an example design option, be adjustable or variable by, for example, a user-input command (not shown), to compensate for variations in ambient air pressure. The system controller 220 then generates the throttle valve control signal 218 to control the throttle 206 orifice to pass the calculated mass air flow, or generates the blower control signal 244 such that the blower 204 urges the calculated mass air flow. Preferably, as described above, the system controller performs a feedback control generation of the throttle valve control signal 218, and/or the blower control signal 244, based on the mass airflow signal 230 from the mass flow sensor 222.

Continuing with the example embodiment in which the temperature and velocity of the output air 202 are directly controlled by the user, the system controller 222 calculates the amount of power required by the air heater 208 to raise the temperature of the mass flow of air by the difference $\Delta T$ between the input air temperature and the user-input Temp$_{CMD}$ temperature, according to Equation Nos. 1-3 above. The system controller then generates the heater power control signal 248 such that the heater power control circuit 246 delivers the calculated power to the electrical air heater 208. The result of the above-described feedback generation of the throttle control signal 218 (and/or blower control signal 244) and the heater power control signal 248, which is based on the user-input Temp$_{CMD}$ and OutVelocity$_{CMD}$, the input air temperature from sensor 214, the mass airflow signal 230, and the cross-sectional area of the exhaust nozzle output port 208B, is that heated air output 202 from the exhaust nozzle output port 208B substantially at the user-input Temp$_{CMD}$ temperature and OutVelocity$_{CMD}$ velocity.

Continuing with the example embodiment in which the temperature and velocity of the output air 202 are directly controlled by the user, the arrangement of the system controller 220 to generate the calculated mass flow rate value such that heated air output 202 at the Temp$_{CMD}$ temperature will necessarily have the OutVelocity$_{CMD}$ velocity is readily implemented. For example, as will be understood by persons of ordinary skill, the velocity of the air 202 is proportional to the mass flow rate of the air 202 multiplied by the temperature of the exhaust air 202 and divided by the temperature of air at standard conditions and cross-sectional area (not specifically labeled) at the exhaust nozzle output port 208B of the air heater 202. Referring to FIG. 2, the cross-sectional area at the exhaust nozzle output port 208B is determined by its specific implementation. A value representing the cross-sectional area may be incorporated in the constant of proportionality and stored in the system controller 220. Referring to FIG. 2, the mass flow rate of the output air 202 is seen as known to the system controller, because it is same as the mass flow rate measured by the mass flow sensor 222. The temperature of the output air 202 is also known to the system controller, because the system controller 220 controls the electrical air heater 208 to generate the air output 202 at the $Temp_{CMD}$ temperature.

With continuing reference to FIG. 2, accuracy of the control of the temperature and flow rate of the output air 202 of systems or methods is a design choice. For example, one error may be identified as $Temp_{error}$=absolute value of ($Temp_{CMD}$-$F_{actual}$), where $T_{actual}$ is a measured temperature of the heated air output of a system embodying the invention, e.g., the heated air output 202 of the example system 200. In a system embodying the invention, such as a system according to the example system 200, implementations are readily constructed based on this disclosure such that $Temp_{error}$ is small. For example, persons of ordinary skill in the art, based on the present disclosure, may readily construct a system according to, for example, the FIG. 2 example system 200, such that $Temp_{error}$ is as small as, for example, approximately five percent or less.

Factors determining or bounding $Temp_{error}$ are readily identified by persons of ordinary skill in the art based on the present disclosure and, in reference to the FIG. 2 example system 200, include: the efficiency of the air heater 208, in terms of watts of heat delivered to the air passing from the heater air input 208A to the heater exhaust nozzle output port 208B, humidity of the air, accuracy of the mass airflow sensor 222, accuracy of the temperature sensor 214 and heat loss through the walls (not specifically labeled) of the air heater tube 212.

A low $Temp_{error}$ is therefore readily obtained because, as will be understood by persons of ordinary skill in the relevant arts, typical commercially available heaters readily identifiable based on this disclosure as implementations of the electrical air heater 208 transfer approximately 100% of the power delivered to the air passing through the heater.

With continuing reference to FIG. 2, lower $Temp_{error}$ may be obtained by including a humidity sensor (not shown) connected to the system controller.

Further, based on simulations and on test data from actual reductions to practice, implementations of a system embodying the invention, such as a system according to the example system 200, are readily constructed based on this disclosure such that lower $Temp_{error}$ can be better than the error typically obtained using a thermocouple in the heated air stream.

With continuing reference to FIG. 2, one optional aspect of one embodiment is providing a polished surface (not separately labeled) such as, for example, gold on an air flow surface (such as an inner surface of the tube 212) of the electrical air heater 208. This optional aspect may provide substantially reduced heat loss through the walls (not separately labeled) of the electrical air heater 208 because a polished surface is very highly reflective to infrared light. Preferably, the material forming the polished inner surface is resistant to corrosion or oxidation, e.g., a stainless steel of a type suitable for heating.

As described and as understood by persons or ordinary skill in the related arts upon reading this disclosure, embodiments and aspects of the invention provide accuracy substantially superior to related art thermocouple-based methods and systems of forced air heater control.

While certain embodiments and features of the invention have been illustrated and described herein, many modifications, substitutions, changes, and equivalents will occur to those of ordinary skill in the art. It is therefore to be understood that the appended claims are intended to cover all such modifications and changes as fall within the spirit of the invention.

I claim:

1. A system for outputting heated air at a controlled temperature and flow rate, comprising: an inlet and an outlet; an electric air blower for urging a flow of air; an electric air heater including an electric resistance element upstream of the outlet; a conduit for conducting air from said electric blower to the electric heater; a mass flow sensor connected upstream of an input of the electric air blower in a direction opposite the flow of air for generating a mass flow measurement signal MassFlow; a temperature sensor connected to an inlet of the electric air heater for generating an input temperature signal $Temp_{IN}$ representing an input temperature; a heater power control circuit for controlling electric power to said electric air heater in response to a first control signal;
    means for controlling mass flow through said electric air heater in response to a second control signal; and a controller receiving the mass flow measurement signal MassFlow and the input temperature signal $Temp_{IN}$ and having a user input for inputting a temperature command signal $Temp_{CMD}$ and a volume command signal $Volume_{CMD}$ used by the controller for outputting air at a controlled temperature, said controller computing $Temp_{CMD}=Temp_{IN}+\Delta T$, $Temp_{CMD}=Temp_{IN}+((K \times PowerIn/MassFlow))$, and $PowerIn=(Temp_{CMD}-Temp_{IN}) \times MassFlow/K$, and generating said first and second control signals, wherein the temperature sensor is arranged at the inlet of said electric air heater for generating said input temperature signal $Temp_{IN}$.

2. The system recited in claim 1, wherein the temperature sensor is arranged between an output of said electric air blower and the inlet of said electric air heater for generating said input temperature signal $Temp_{IN}$.

3. The system recited in claim 1, wherein said input temperature signal: $Temp_{IN}$ is input as an ambient air temperature.

4. The system recited in claim 1, wherein the means for controlling mass flow through said electric air heater comprises a blower control for controlling a volume of air flow produced by said electric air blower.

5. The system recited in claim 1, wherein the means for controlling mass flow through said electric air heater comprises a controllable air valve or throttle positioned between an output of said electric air blower and the inlet of said electric air heater.

6. The system recited in claim 1, wherein an
    and the means for controlling mass flow through said electric air heater is a controllable air valve or throttle positioned between an output of said electric air blower and the inlet of said electric air heater.

7. The system recited in claim 1, wherein said electric air heater generates between 1 kW and 30 kW of power.

8. A method for outputting heated air at a controlled temperature and flow rate, comprising: an inlet and an outlet; providing a flow of air by means of an electric air blower; conducting the flow of air to an electric air heater including an electric resistance element upstream of the outlet; using a mass flow sensor connected upstream of an inlet of the electric air blower in a direction opposite the flow of air for generating a mass flow measurement signal MassFlow; generating an input temperature signal $Temp_{IN}$ representing an input temperature; controlling electric power to said electric air heater in response to a first control signal; controlling mass flow through said electric air heater in response to a second control signal; and receiving the mass flow measurement signal MassFlow and the input temperature signal $Temp_{IN}$ and providing a user input for inputting a temperature command signal $Temp_{CMD}$ and a volume command signal $Volume_{CMD}$ used by the controller for outputting air at a controlled temperature, calculating $Temp_{CMD} = Temp_{IN} + \Delta T$, $Temp_{CMD} = Temp_{IN} + ((K \times PowerIn/MassFlow))$, and $PowerIn = (Temp_{CMD} - Temp_{IN}) \times MassFlow/K$, and generating said first and second control signals as a function of the calculation, wherein the step of generating said inlet temperature signal $Temp_{IN}$ is performed with a temperature sensor arranged at the input of said electric air heater.

9. The method recited in claim 8, wherein the step of controlling mass flow through said electric air heater is performed with a controllable air valve or throttle positioned between an output of said electric air blower and the inlet of said electric air heater.

* * * * *